(12) United States Patent
Chang

(10) Patent No.: US 6,754,790 B2
(45) Date of Patent: Jun. 22, 2004

(54) METHOD OF ACCESSING MEMORY OF DE-INTERLEAVING UNIT

(75) Inventor: Wen-Jeng Chang, Kaohsiung (TW)

(73) Assignee: VIA Optical Solution, Inc., Taipei Hsien (TW)

(*) Notice: Subject to any disclaimer, the term of this patent is extended or adjusted under 35 U.S.C. 154(b) by 180 days.

(21) Appl. No.: 10/173,234

(22) Filed: Jun. 14, 2002

(65) Prior Publication Data

US 2003/0041219 A1 Feb. 27, 2003

(30) Foreign Application Priority Data

Aug. 24, 2001 (TW) .................................. 90120811 A (51) Int. Cl.⁷ .............................................. G06F 12/00
(52) U.S. Cl. ........................ 711/157; 711/219; 711/112
(58) Field of Search ............................... 711/157, 219, 711/112

(56) References Cited

U.S. PATENT DOCUMENTS

| 5,453,964 A | * | 9/1995 | Shimizume | 369/47.32 |
| 5,517,484 A | * | 5/1996 | Takagi et al. | 369/53.35 |
| 6,112,324 A | * | 8/2000 | Howe et al. | 714/763 |
| 6,346,896 B1 | * | 2/2002 | Su et al. | 341/81 |

* cited by examiner

Primary Examiner—Matthew Kim
Assistant Examiner—Shane Thomas
(74) Attorney, Agent, or Firm—J.C. Patents (57) ABSTRACT

A method is proposed for accessing the memory of a de-interleaving unit. The conventional access method has the drawback of ineffective use of the memory space of the de-interleaving unit, while the proposed method uses only about half the memory space for implementation. The proposed method utilizes a specially-formulated write-operation interleaving algorithm to write data into the memory of the de-interleaving unit, and subsequently utilizes a specially-formulated read-operation de-interleaving algorithm to read data from the memory of the de-interleaving unit.

4 Claims, 7 Drawing Sheets

| WR | C0 | C1 | C2 | C3 | C4 | C5 | C6 | C7 | C8 | C9 | C10 | C11 | C12 | C13 | C14 | C15 | C16 | C17 | C18 | C19 | C20 | C21 | C22 | C23 | C24 | C25 | C26 | C27 |
|----|----|----|----|----|----|----|----|----|----|----|-----|-----|-----|-----|-----|-----|-----|-----|-----|-----|-----|-----|-----|-----|-----|-----|-----|-----|
| 0 | 0 | 116 | 232 | 348 | 464 | 580 | 696 | 812 | 928 | 1044 | 1160 | 1276 | 1392 | 1508 | 1564 | 1444 | 1324 | 1204 | 1084 | 964 | 844 | 724 | 604 | 484 | 364 | 244 | 124 | 4 |
| 1 | 1 | 117 | 233 | 349 | 465 | 581 | 697 | 813 | 929 | 1045 | 1161 | 1277 | 1393 | 1509 | 1565 | 1445 | 1325 | 1205 | 1085 | 965 | 845 | 725 | 605 | 485 | 365 | 245 | 125 | 5 |
| 2 | 2 | 118 | 234 | 350 | 466 | 582 | 698 | 814 | 930 | 1046 | 1162 | 1278 | 1394 | 1510 | 1566 | 1446 | 1326 | 1206 | 1086 | 966 | 846 | 726 | 606 | 486 | 366 | 246 | 126 | 6 |
| 3 | 3 | 119 | 235 | 351 | 467 | 583 | 699 | 815 | 931 | 1047 | 1163 | 1279 | 1395 | 1511 | 1567 | 1447 | 1327 | 1207 | 1087 | 967 | 847 | 727 | 607 | 487 | 367 | 247 | 127 | 7 |
| 4 | 4 | 120 | 236 | 352 | 468 | 584 | 700 | 816 | 932 | 1048 | 1164 | 1280 | 1396 | 1512 | 1568 | 1448 | 1328 | 1208 | 1088 | 968 | 848 | 728 | 608 | 488 | 368 | 248 | 128 | 8 |
| 5 | 5 | 121 | 237 | 353 | 469 | 585 | 701 | 817 | 933 | 1049 | 1165 | 1281 | 1397 | 1513 | 1569 | 1449 | 1329 | 1209 | 1089 | 969 | 849 | 729 | 609 | 489 | 369 | 249 | 129 | 9 |
| . | | | | | | | | | | | | | . | | | | | | | | | | | | | | | |
| . | | | | | | | | | | | | | . | | | | | | | | | | | | | | | |
| . | | | | | | | | | | | | | . | | | | | | | | | | | | | | | |
| . | | | | | | | | | | | | | . | | | | | | | | | | | | | | | |
| . | | | | | | | | | | | | | . | | | | | | | | | | | | | | | |
| 47 | 47 | 163 | 279 | 351 | 511 | 627 | 743 | 859 | 975 | 1092 | 1207 | 1323 | 1439 | 1555 | 1611 | 1491 | 1371 | 1251 | 1131 | 1011 | 891 | 771 | 651 | 531 | 411 | 291 | 171 | 51 |
| 48 | 48 | 164 | 280 | 396 | 512 | 628 | 744 | 860 | 976 | 1093 | 1208 | 1324 | 1440 | 1556 | 1612 | 1492 | 1372 | 1252 | 1132 | 1012 | 892 | 772 | 652 | 532 | 412 | 292 | 172 | 52 |
| 49 | 49 | 165 | 281 | 397 | 513 | 629 | 745 | 861 | 977 | 1094 | 1209 | 1325 | 1441 | 1557 | 1613 | 1493 | 1373 | 1253 | 1133 | 1013 | 893 | 773 | 653 | 533 | 413 | 293 | 173 | 53 |

FIG. 4

| RD | C0 | C1 | C2 | C3 | C4 | C5 | C6 | C7 | C8 | C9 | C10 | C11 | C12 | C13 | C14 | C15 | C16 | C17 | C18 | C19 | C20 | C21 | C22 | C23 | C24 | C25 | C26 | C27 |
|---|---|---|---|---|---|---|---|---|---|---|---|---|---|---|---|---|---|---|---|---|---|---|---|---|---|---|---|---|
| 8 | 8 | 128 | 248 | 368 | 488 | 608 | 728 | 848 | 968 | 1088 | 1208 | 1328 | 1448 | 1568 | 1512 | 1396 | 1280 | 1164 | 1048 | 932 | 916 | 700 | 584 | 468 | 352 | 236 | 120 | 4 |
| 9 | 9 | 129 | 249 | 369 | 489 | 609 | 729 | 849 | 969 | 1089 | 1209 | 1329 | 1449 | 1569 | 1513 | 1397 | 1281 | 1165 | 1049 | 934 | 817 | 701 | 585 | 469 | 353 | 237 | 121 | 5 |
| 10 | 10 | 130 | 250 | 370 | 490 | 610 | 730 | 850 | 970 | 1090 | 1210 | 1330 | 1450 | 1570 | 1514 | 1398 | 1282 | 1166 | 1050 | 935 | 818 | 702 | 586 | 470 | 354 | 238 | 122 | 6 |
| 11 | 11 | 131 | 251 | 371 | 491 | 611 | 731 | 851 | 971 | 1091 | 1211 | 1331 | 1451 | 1571 | 1515 | 1399 | 1283 | 1167 | 1051 | 936 | 819 | 703 | 587 | 471 | 355 | 239 | 123 | 7 |
| 12 | 12 | 132 | 252 | 372 | 492 | 612 | 732 | 852 | 972 | 1092 | 1212 | 1332 | 1452 | 1572 | 1516 | 1400 | 1284 | 1168 | 1052 | 937 | 820 | 704 | 588 | 472 | 356 | 240 | 124 | 8 |
| 13 | 13 | 133 | 253 | 373 | 493 | 613 | 733 | 853 | 973 | 1093 | 1213 | 1333 | 1453 | 1573 | 1517 | 1401 | 1285 | 1169 | 1053 | 938 | 821 | 705 | 589 | 473 | 357 | 241 | 125 | 9 |
| . . . . . |
| 56 | 56 | 176 | 296 | 416 | 536 | 656 | 776 | 896 | 1016 | 1136 | 1256 | 1376 | 1496 | 1616 | 1560 | 1444 | 1328 | 1212 | 1096 | 980 | 864 | 748 | 632 | 516 | 400 | 284 | 168 | 52 |
| 57 | 57 | 177 | 297 | 417 | 537 | 657 | 777 | 897 | 1017 | 1137 | 1257 | 1377 | 1497 | 1617 | 1561 | 1445 | 1329 | 1213 | 1097 | 981 | 865 | 749 | 633 | 517 | 401 | 285 | 169 | 53 |
| 58 | 58 | 178 | 298 | 418 | 538 | 658 | 778 | 898 | 1018 | 1138 | 1258 | 1378 | 1498 | 1618 | 1562 | 1446 | 1330 | 1214 | 1098 | 982 | 866 | 750 | 634 | 518 | 402 | 286 | 170 | 54 |

METHOD OF ACCESSING MEMORY OF DE-INTERLEAVING UNIT

CROSS-REFERENCE TO RELATED APPLICATION

This application claims the priority benefit of Taiwanese application Ser. No. 90120811, filed on Aug. 24, 2001.

BACKGROUND OF THE INVENTION

1. Field of the Invention

This invention relates to a method of accessing memory of de-interleaving unit in an optical disc device.

2 Description of Related Art

Figure 1:
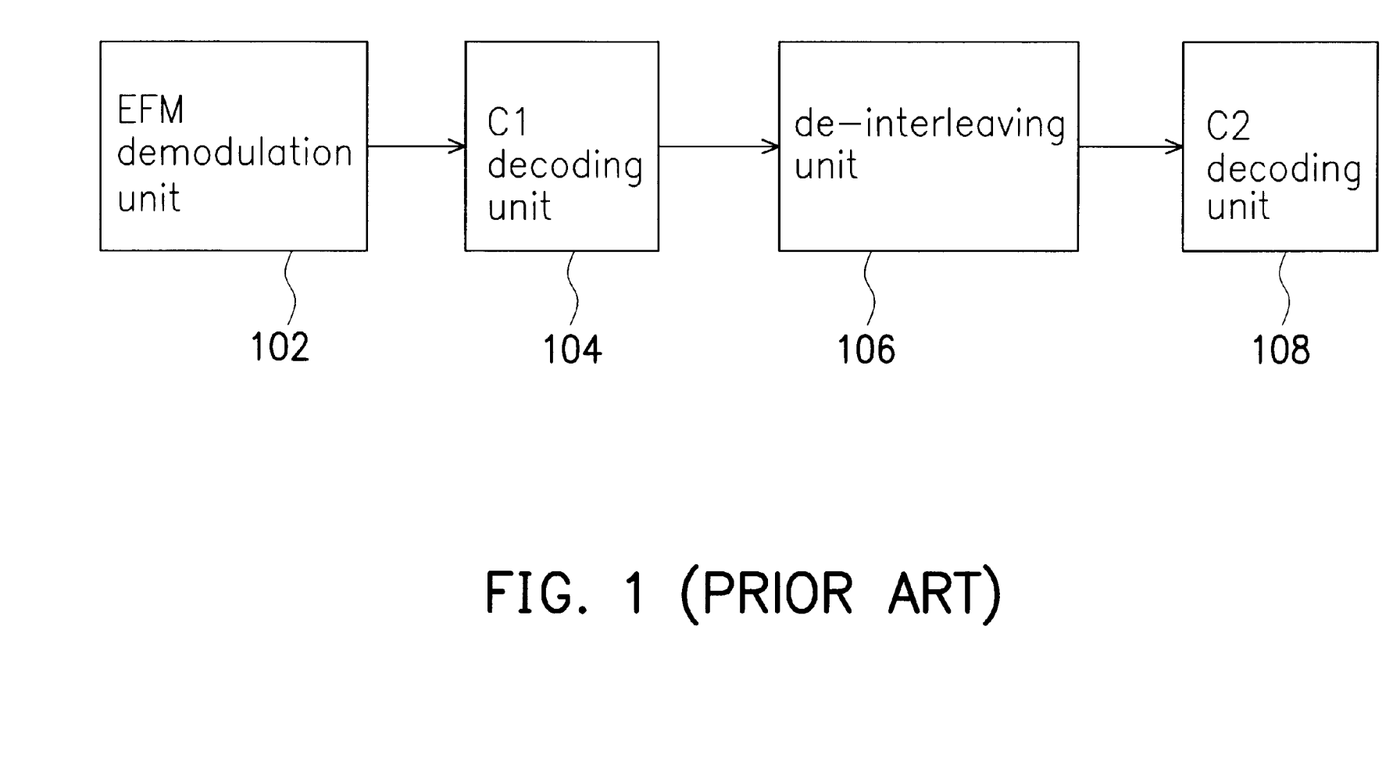
FIG. 1 (PRIOR ART) is a schematic diagram showing a series of functional units involved in a read operation in a CD-ROM drive.

To increase the reliability of read operation on a CD-ROM (Compact-Disc Read-Only-Memory) drive, data are interleaved before they are recorded on a CD-ROM disc. Therefore, the read operation in the CD-ROM drive should include a de-interleaving procedure. FIG. 1 is a schematic diagram showing a series of functional units involved in a read operation in the CD-ROM drive, which includes an EFM demodulation unit 102, a C1 decoding unit 104, a de-interleaving unit 106, and a C2 decoding unit 108. The EFM demodulation unit 102 is capable of demodulating data on the disc into a stream of 8-bit data. After the C1 decoding unit 104 receives a frame of 32 bytes (8-bit) data from the EFM demodulation unit 102, it decodes them into a frame of 28 bytes data and then transfers these decoded data to the de-interleaving unit 106 for de-interleaving. The de-interleaving unit 106 then transfers the de-interleaved data to the C2 decoding unit 108. During the de-interleaving procedure, each frame includes 28 bytes of data.

Figure 2:
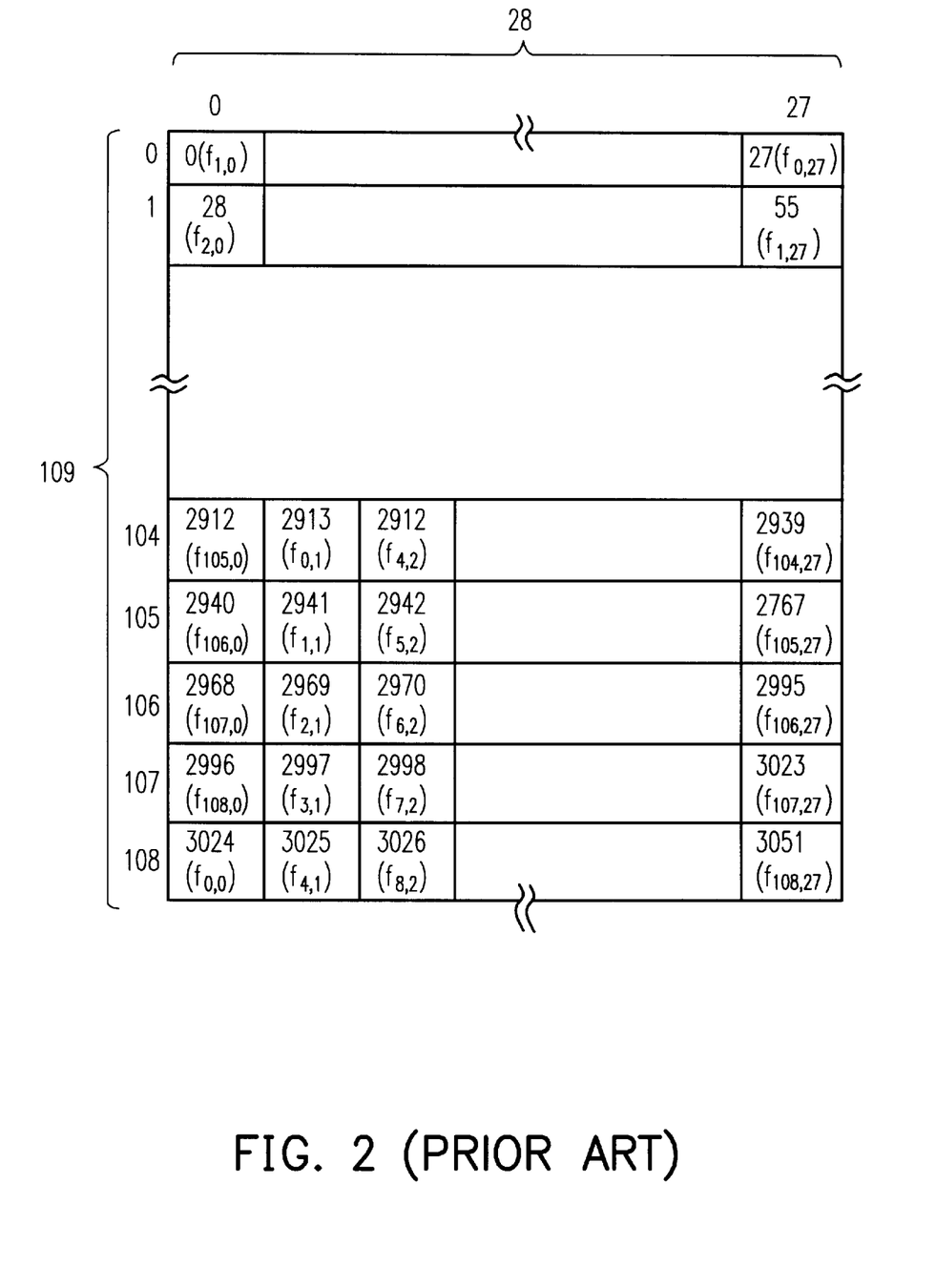
FIG. 2 (PRIOR ART) is a schematic diagram showing a memory allocation for the memory of de-interleaving unit according to the conventional access method.

The de-interleaving unit 106 includes a memory unit for the de-interleaving process. FIG. 2 shows the memory allocation for the memory of the de-interleaving unit 106. Referring to FIG. 2 together with FIG. 1, the address range is from 0 to 3051. The 28 8-bit (byte) data in the first frame from the C1 decoding unit 104 are respectively denoted by (f0, 0), (f0, 1), . . . , (f0, 27). When the C1 decoding unit 104 transfers the first frame to the de-interleaving unit 106, data in the first frame are written into the memory of the de-interleaving unit 106 in such a manner according to the conventional access method as following. The first data (f0, 0) is written into Row 108 Column 0(i.e., the address 3024); the second data (f0, 1) is written into Row 104 Column 1(i.e., the address 2913); and so forth, the last data (f0, 27) is written into Row 0 Column 26 (i.e., the address 27).

After the first frame is written completely, the second frame is then written into the de-interleaving unit 106. In the following, the 28 8-bit data in the second frame from the C1 decoding unit 104 are respectively denoted by (f1, 0), (f1, 1), . . . , (f1, 27). When the C1 decoding unit 104 transfers the second frame to the de-interleaving unit 106, data in the second frame are written into the memory of the de-interleaving unit 106 in such a manner according to conventional access method that the first data (f1, 0) is written into Row 109 Column 0(i.e., the address 0); the second data (f1, 1) is written into Row 105 Column 1(i.e., the address 2914); and so forth the last data (f1, 27) is written into the Row 1 Column 26(i.e., the address 55). The similar procedure is repeated for each of the subsequent frames.

When a certain row in the memory of the de-interleaving unit 106 is fully rewritten by the decoded data, the de-interleaving unit 106 will then output all the data stored in that row to the C2 decoding unit 108. For example, when Row 108 is fully rewritten, the de-interleaving unit 106 will output all the data stored in Row 108 to the C2 decoding unit 108. In other words, when address 3051 (Row 108 Column 27) is rewritten by (f108, 27), all data stored in Row 108, including 0(f0, 0), (f4, 1), (f8, 2), . . . and (f108, 27) will be transferred to the C2 decoding unit 108.

One drawback to the forgoing memory access scheme, however, is that the memory of the de-interleaving unit 106 is ineffectively utilized (i.e., some memory locations are unused during the de-interleaving process). By the conventional memory access scheme, it requires a total of 109*28= 3052 bytes of memory space for the de-interleaving process, which is considerably large and thus is cost-ineffective in memory utilization.

SUMMARY OF THE INVENTION

It is therefore an objective of this invention to provide a method of accessing the memory of a de-interleaving unit, which allows effective use of the memory space of the de-interleaving unit to save cost.

The proposed method according to the invention utilizes a special access method to write into and read from the memory of the de-interleaving unit. The write operation is formulated for the purpose of storing a sequence of frames of data from a decoding unit at address locations specified by Write Memory Address WMA based on Write Frame Index WFIDX and Control Word Count CWCNT. The read operation according to the invention is formulated for the purpose of reading a sequence of de-interleaved frames of data from the memory of the de-interleaving unit specified by Read Memory Address RAM based on Read Frame Index RFIDX and Control Word Count CWCNT.

The method according to the invention reduces the required memory space in the de-interleaving unit by half as compared to the prior art for performing a de-interleaving process and is therefore more cost-effective t than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention is designed for use to effectively use the memory of the de-interleaving unit for performing a de-interleaving process, so that the required memory can be reduced as compared to the prior art to make the memory utilization more cost-effective than the prior art.

Figure 3:
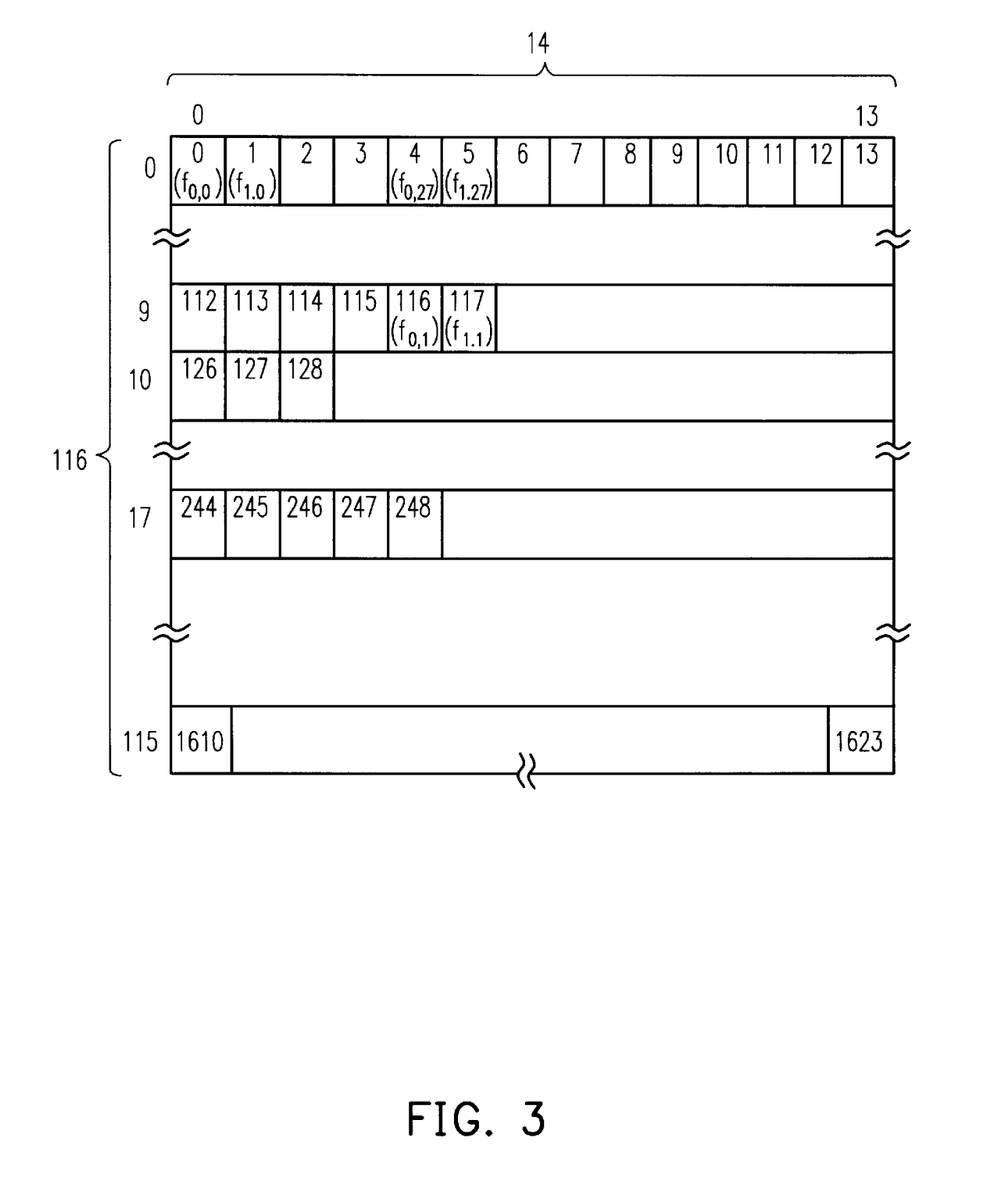
FIG. 3 is a schematic diagram showing the memory allocation for the memory of de-interleaving unit according to the invention.

FIG. 3 is a schematic diagram showing the memory allocation for the memory of de-interleaving unit according to the method of the invention. The invention allows the total memory size in the de-interleaving unit 106 to be only 14*116=1624 bytes, which is nearly half of that required by the prior art. As shown in FIG. 3, the address range is from 0 to 1623. In the following, the 28 8-bit data in the first frame from the C1 decoding unit 104 are respectively denoted by (f0, 0), (f0, 1), . . . , (f0, 27). When the C1 decoding unit 104 transfers the first frame to the de-interleaving unit 106, the data contained in the first frame are written into the memory of the de-interleaving unit 106 according to the method of the invention in such a manner that the first data (f0, 0) is written into Row 0 Column 0 (i.e., the address 0); the second data (f0, 1) is written into Row 9 Column 4 (i.e., the address 116); and so forth until the last data (f0, 27) is written into Row 0 Column 4 (i.e., the address 4).

Figure 4:
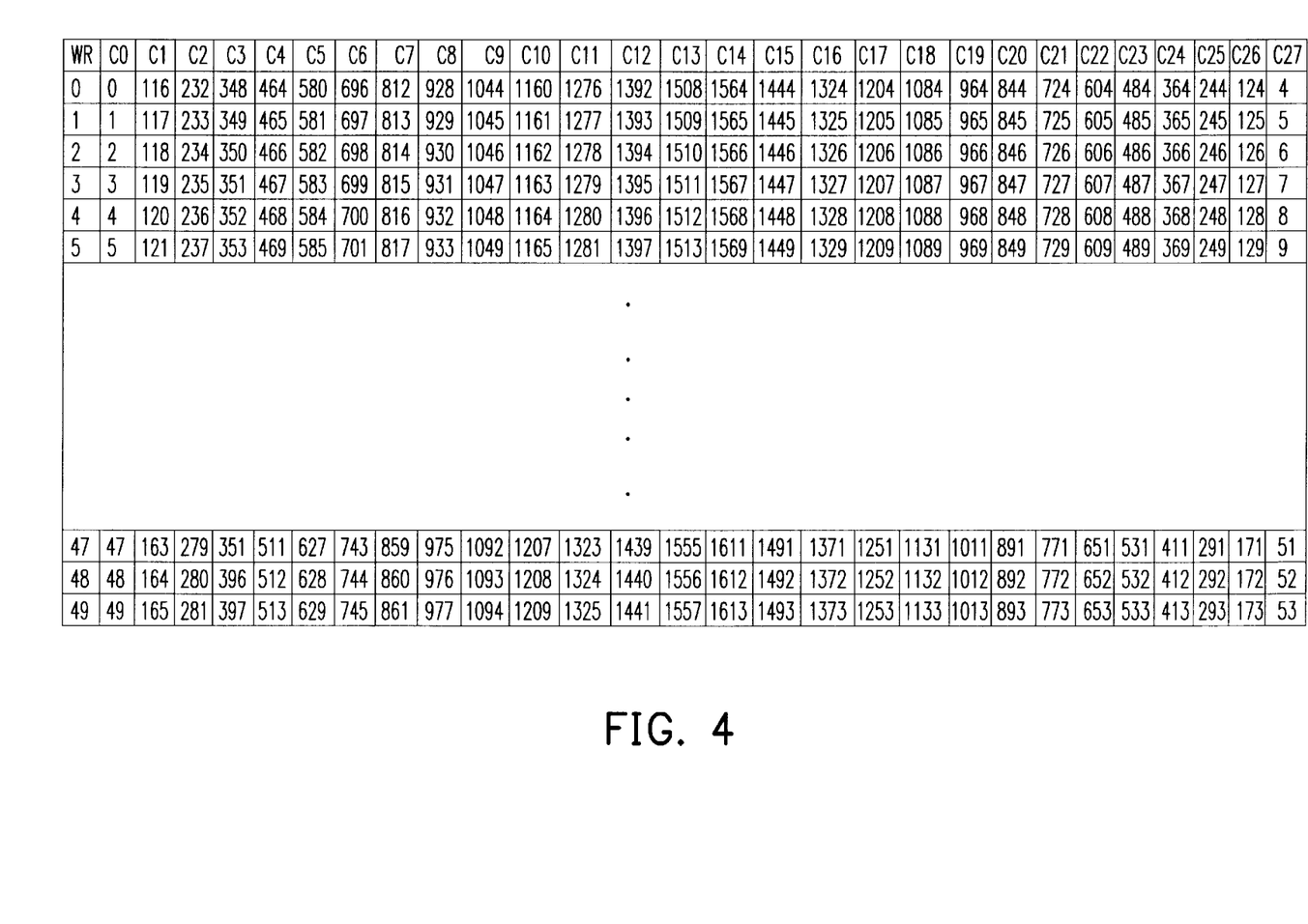
FIG. 4 is a schematic diagram showing the address mapping for each frame during write operation.

After the first frame is completely written into the memory, the second frame from the C1 decoding unit 104 is then written into the de-interleaving unit 106. The 28 8-bit data in the second frame from the C1 decoding unit 104 are respectively denoted by (f1, 0), (f1, 1), . . . , (f1, 27). When the C1 decoding unit 104 transfers the second frame to the de-interleaving unit 106, data in the second frame are written into the memory of the de-interleaving unit 106 according to the method of the invention in such a manner that the first data (f1, 0) is written into Row 0 Column 1(i.e., the address 1); the second data (f1, 1) is written into Row 9 Column 5 (i.e., the address 117); and so forth until the last data (f1, 27) is written into Row 0 Column 5 (i.e., the address 5). The similar procedure is repeated for each of the subsequent frames. FIG. 4 shows the address mapping for each frame during write operation.

In FIG. 4, the term "WR" represents the sequence of the frames to be de-interleaved. That is, WR 0 represents the first frame, and WR 1 represents the second frame and so on. The terms C0~C27 represent the data sequence in the frame. The write address for 28 bytes data of the first frame (WR) is respectively 0, 116, 232, . . . 124 and 4.

The write address for other frames is known from FIG. 4.

Figure 5:
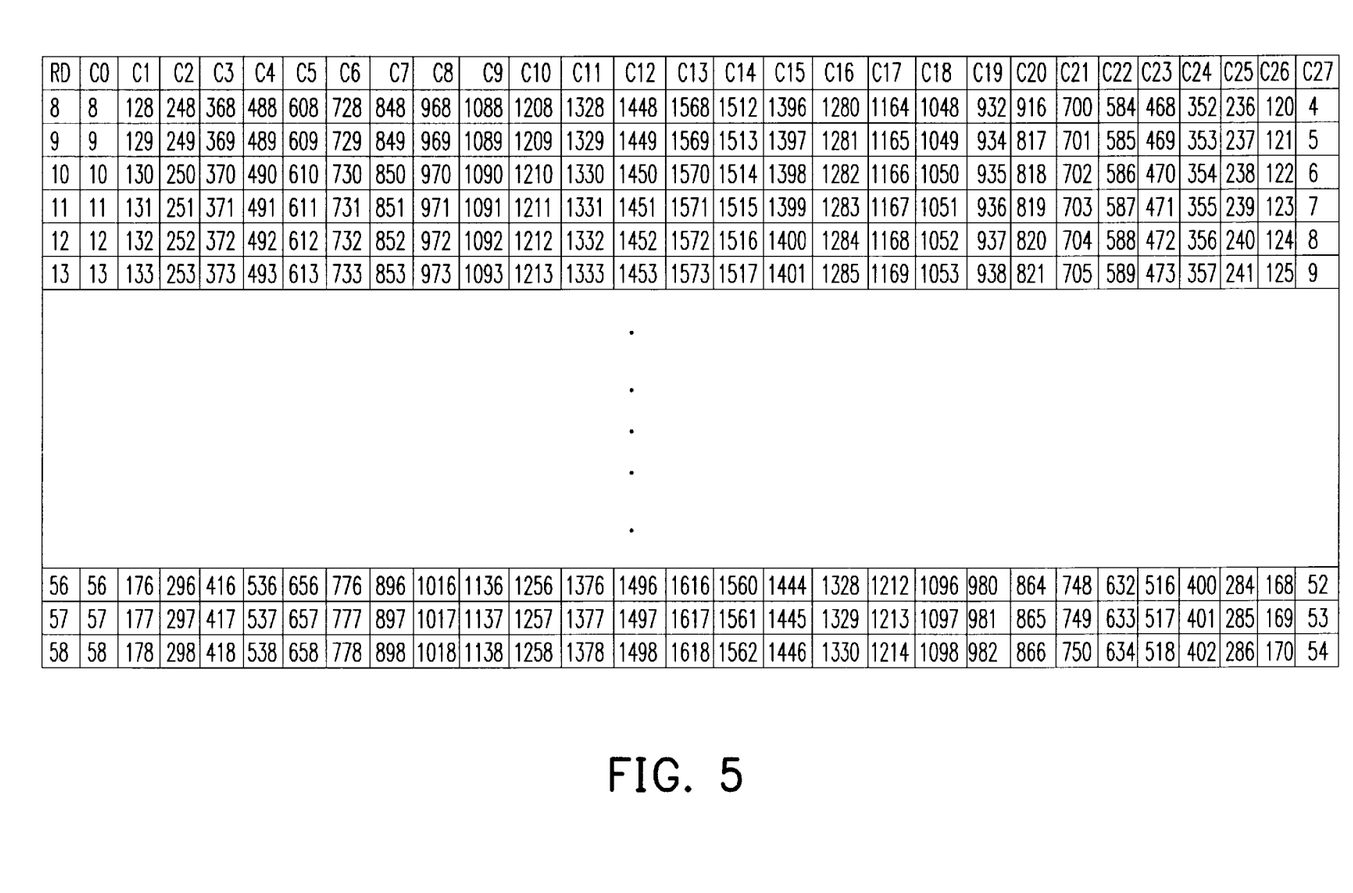
FIG. 5 is a schematic diagram showing the address mapping for each frame during read operation.

After the write operation for some incoming frames is completed, the de-interleaving unit 106 then reads data stored in the memory according to the method of the invention and outputs these data to the C2 decoding unit 108. FIG. 5 shows the address mapping for each frame during this read operation. It is to be noted that a certain frame can be read only after the last data in this frame is already rewritten (or updated). For example, as shown in FIG. 5, the data in Row 0 (which includes data in the address 8, 128, 248, . . . 4) can be read only after all data in Row 0 have been rewritten (i.e., the last address, address 4, in this frame is rewritten).

The write operation according to the method of the invention is based on the parameter WFIDX (Write Frame Index, which is used to indicate the index of the currently-received frame from the C1 decoding unit 104) and CWCNT (Code Word Count, which is used to indicate the sequence of data in the currently-received frame) to write the currently-received frame into the memory of the de-interleaving unit 106 at WMA (Write Memory Address). The parameter WFIDX indicates which frame from the C1 decoding unit 104 is currently being written into the de-interleaving unit 106; the parameter CWCNT indicates which data in the currently-received frame is being written into the de-interleaving unit 106; and the parameter WMA indicates the address where the data is to be stored in the memory of the de-interleaving unit 106.

Figure 6:
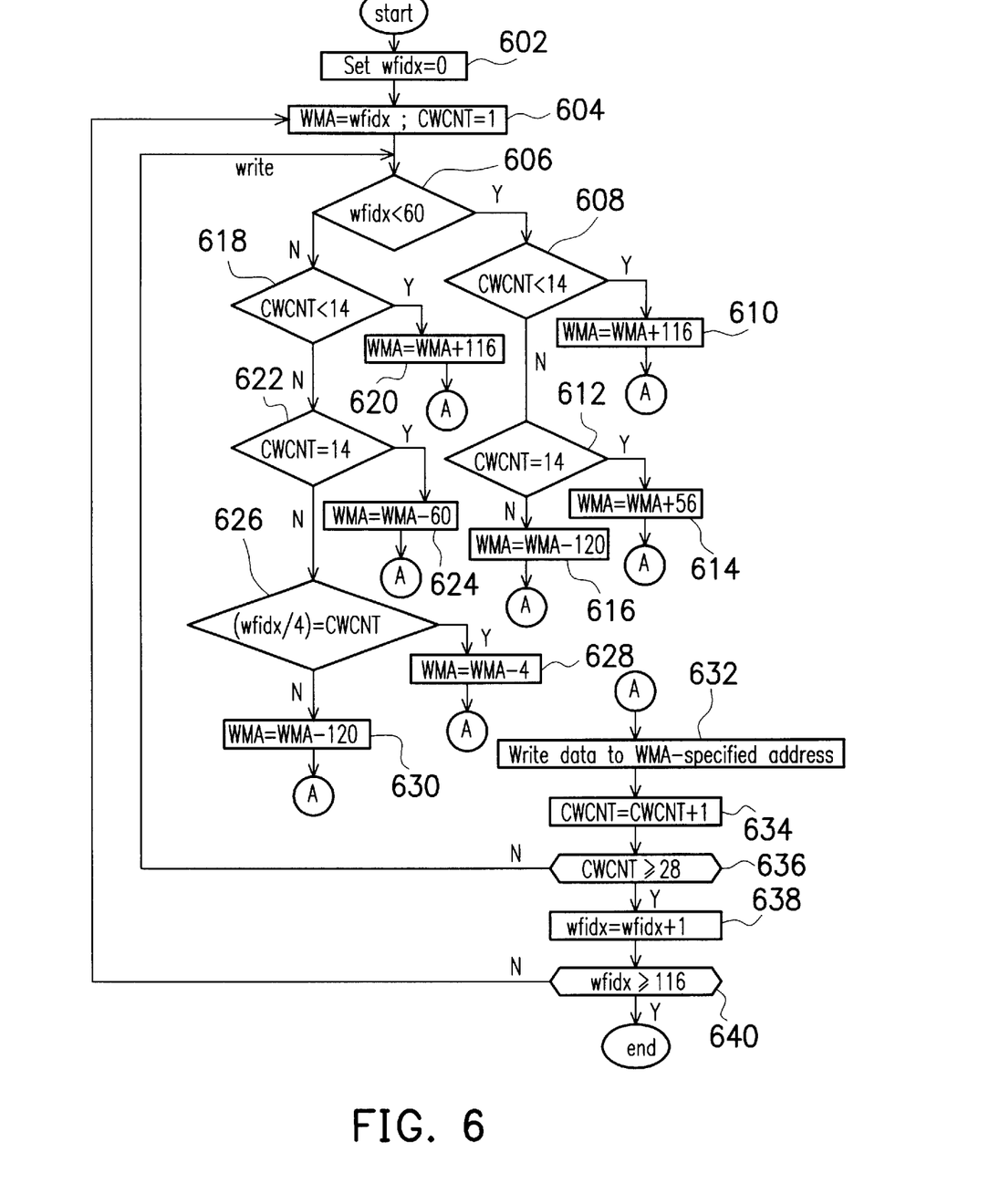
FIG. 6 is a flow diagram showing the steps in the method of the invention for write operation.

FIG. 6 is a flow diagram showing the steps in the method of the invention to compute for the value of the parameter WMA. As shown, in the first step 602, WFIDX is set to 0. In the next step 604, WMA is set to be equal to WFIDX, and CWCNT is set to be equal to 1. The action of the step 604 is performed due to the fact that the WMA corresponding to the first data in each frame (whose CWCNT is equal to 0) is directly related to WFIDX. For example if WFIDX=0, then WMA=0, and if WFIDX=1, then WMA=1. Therefore, once the WMA value is known, the first data in each of the frames from the C1 decoding unit 104 can be written into the memory of the de-interleaving unit 106. The write operation is then directed to the next data (it is required that CWCNT= 1).

The subsequent steps shown in FIG. 6 are used to compute for the current WMA value for the currently-received data from the C1 decoding unit 104 based on the previous WMA value for the previously-received data. Details of these steps are described in the following.

(Step 606) It is checked whether WFIDX is less than 60. If YES, the procedure goes to step 608; or, the procedure goes to the step 618.

(Step 608) In the case of WFTDX being less than 60, it is checked whether CWCNT is less than 14. If YES, the procedure goes to step 610; or, the procedure goes to step 612.

(Step 610) In the case of CWCNT being less than 14, WMA=WMA+116.

(Step 614) In the case of CWCNT being equal to 14, WMA=WMA+56, (Step 616) In the case of CWCNT being greater than 14, WMA 32 WMA−120.

(Step 618) In the case of WFIDX being equal to or greater than 60, it is checked whether CWCNT is less than 14. If YES, the procedure goes to step 620; or, the procedure goes to step 622.

(Step 620) In the case of CWCNT being less than 14, WMA=WMA+116.

(Step 624) In the case of CWCNT being equal to 14, WMA=WMA−60.

(Step 626) In the case of CWCNT being greater than 14, it is checked whether the result of dividing WFIDX by 4 is equal to the current CWCNT value. If YES, the procedure goes to step 628; or, the procedure goes to step 630.

(Step 628) In the case of the result of dividing WFIDX by 4 being equal to the current CWCNT value, WMA=WMA−4.

(Step 630) In the case of the result of dividing WFIDX by 4 being unequal to the current CWCNT value, WMA=WMA−120.

(Step 632) Based on the WMA value obtained through the forgoing steps, the corresponding data into the memory of the de-interleaving unit is written.

(Step 634) CWCNT=CWCNT+1;

(Step 636) It is checked whether the current CWCNT value is equal to or greater than 28. If YES, the procedure goes to step 638; or, the procedure returns to step 606 to check whether WFIDX is less than 60 and repeats the subsequent steps for the next WMA value to write the next incoming data.

(Step 638) In the case of CWCNT being equal to or greater than 28, WFIDX=WFIDX+1.

(Step 640) It is checked whether the current WFIDX value is equal to or greater than 116. If YES, the procedure is ended; or, the procedure returns to step 604 to set WMA= WFIDX and CWCNT=1 and repeats the subsequent steps for the next WMA value to write the next incoming data.

Based on the foregoing procedure, those skilled in the art can obtain the address mapping shown in FIG. 4.

After a certain incoming frame is completely written, the de-interleaving unit 106 then reads the data stored in the memory according to the method of the invention and outputs these data to the C2 decoding unit 108. The read operation according to the method of the invention is based on RFIDX (Read Frame Index) and CWCNT to obtain the parameter RMA (Read Memory Address) that indicates the memory address to be accessed. The parameter RFIDX indicates which frame in the memory of the de-interleaving unit 106 is currently being accessed. The parameter CWCNT indicates which data in the currently-accessed frame to be read. The parameter RMA indicates the address where the data word being read is stored in the memory of the de-interleaving unit 106.

Figure 7:
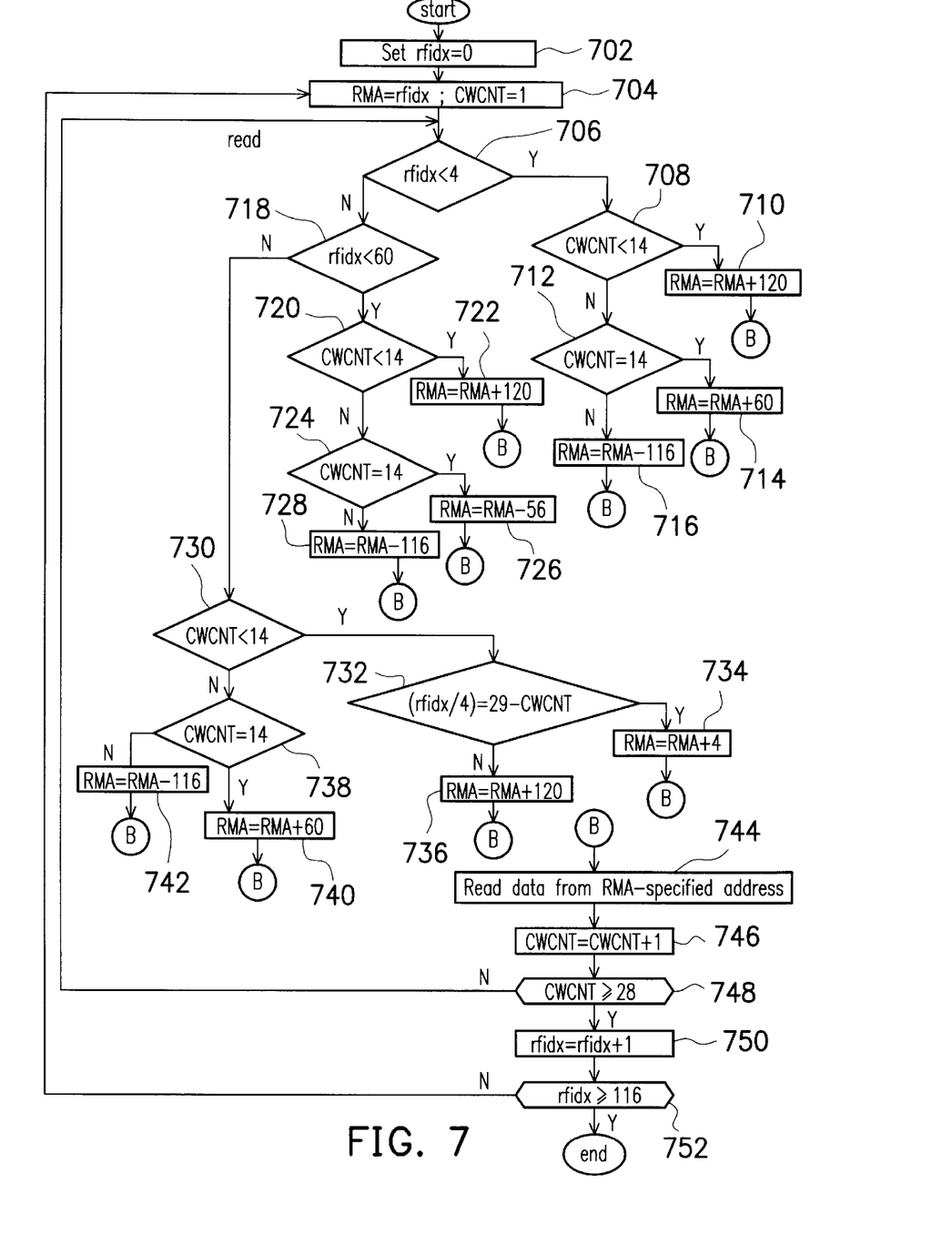
FIG. 7 is a flow diagram showing the steps in the method of the invention for read operation.

FIG. 7 is a flow chart showing the steps in the method of the invention to compute for the value of the parameter RMA for a read operation. As shown, in the first step 702, RFIDX is set to 0. In the next step 704, RMA is set to be equal to RFIDX, and CWCNT is set to be equal to 1. The action of step 704 is so performed due to the fact that the RMA corresponding to the first data in each frame (whose CWCNT is equal to 0) is directly related to RFIDX. For example, if RFIDX=8, then RMA=8, and if RFIDX=9, then RMA=9. Therefore, once the RMA value is known, the data stored in the address specified by RMA can be accessed and transferred to the C2 decoding unit 108.

The subsequent steps shown in FIG. 7 are used to compute for the current RMA value based on the previous RMA value to read data from the RMA-specified address in the memory of the de-interleaving unit 106 and transfer the accessed data to the C2 decoding unit 108. Details of these steps are described in the following.

(Step 706) It is checked whether RFIDX is less than 4. If YES, the procedure goes to step 708; or, the procedure goes to step 718.

(Step 708) In the case of WFIDX being less than 4, it is checked whether CWCNT is less than 14. If YES, the procedure goes to step 710; or, the procedure goes to step 712.

(Step 710) In the case of CWCNT being less than 14, RMA=RMA+120.

(Step 714) In the case of CWCNT being equal to 14, RMA=RMA+60.

(Step 716) In the case of CWCNT being greater than 14, RMA=RMA−116.

(Step 718) In the case of RFIDX being equal to or greater than 4, it is checked whether RFIDX is less than 60. If YES, the procedure goes to step 720; or, the procedure goes to step 730.

(Step 720) In the case of RFIDX being less than 60, it is checked whether CWCNT is less than 14. If YES, the procedure goes to step 722; or, the procedure goes to step 724.

(Step 722) In the case of CWCNT being less than 14, RMA=RMA+120.

(Step 726) In the case of CWCNT being equal to 14, RMA=RMA−56.

(Step 728) In the case of CWCNT being greater than 14, RMA=RMA−116.

(Step 730) In the case of RFIDX being equal to or greater than 60, it is checked whether CWCNT is less than 14. If YES, the procedure goes to step 732; or, the procedure goes to step 738.

(Step 732) In the case of CWCNT being less than 14, it is checked whether the result of dividing RFIDX by 4 is equal to the result of 29 minus CWCNT. If YES, the procedure goes to step 734; or, the procedure goes to step 736.

(Step 734) In the case of the result of dividing RFIDX by 4 being equal to the result of 29 minus CWCNT, RMA=RMA+4.

(Step 736) In the case of the result of dividing RFIDX by 4 being unequal to the result of 29 minus CWCNT, RMA=RMA+120.

(Step 740) In the case of CWCNT being equal to 14, RMA=RMA+60.

(Step 742) In the case of CWCNT being greater than 14, RMA=RMA−116.

(Step 744) Based on the RMA value obtained through the forgoing steps, data is read from the RMA-specified address in the memory of the de-interleaving unit.

(Step 746) CWCNT=CWCNT+1.

(Step 748) It is checked whether the current CWCNT value is equal to or greater than 28. If YES, the procedure goes to step 750; or, the procedure returns to step 706.

(Step 750) In the case of CWCNT being equal to or greater than 28, RFIDX=RFIDX+1.

(Step 752) It is checked whether the current RFIDX value is equal to or greater than 116. If YES, the procedure is ended; or, the procedure returns to step 704 to reset RMA=RFIDX and CWCNT=1 and repeats the subsequent steps for the next RMA value to read the next data from the memory of the de-interleaving unit.

Based on the foregoing procedure, those skilled in the art can obtain the address mapping scheme shown in FIG. 5.

The invention can reduce the required memory space in the de-interleaving unit, substantially by half, for performing the de-interleaving process and is therefore more cost-effective than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed:

1. A method for accessing a memory of a de-interleaving unit to write a sequence of frames into the memory of the de-interleaving unit at an address specified by a Write Memory Address WMA based on a Write Frame Index WFIDX and a Code Word Count CWCNT;

the method comprises the steps of:
  setting the WFIDX, WMA, and CWCNT;
  checking whether WFIDX is less than a first preset value;
    in the case of WFIDX being less than the first preset value, checking whether CWCNT is less than a second preset value;
    in the case of CWCNT being less than the second preset value, adding 116 to WMA;
    in the case of CWCNT being equal to the second preset value, adding 56 to WMA;
    in the case of CWCNT being greater than the second preset value, subtracting 120 from WMA;
  in the case of WFIDX being equal to or greater than the first preset value, checking whether CWCNT is less than the second preset value;
    in the case of CWCNT being less than the second preset value, adding 116 to WMA;

in the case of CWCNT being equal to the second preset value, subtracting 60 from WMA;

in the case of CWCNT being greater than the second preset value, checking whether the result of dividing WFIDX by 4 is equal to CWCNT;

in the case of the result of dividing WFIDX by 4 being equal to CWCNT, subtract 4 from the current WMA value;

in the case of the result of dividing WFIDX by 4 being unequal to CWCNT, subtracting 120 from WMA;

writing the currently-received data from the decoding unit into the WMA address in the memory of the de-interleaving unit;

adding 1 to CWCNT;

checking whether CWCNT is equal to or greater than 28;

in the case of CWCNT being equal to or greater than 28, add 1 to WFIDX;

checking whether WFIDX is equal to or greater than 116; if YES, ending the procedure; or, returning to the setting step; and in the case of CWCNT being less than 28; returning to the step of checking whether WFIDX is less than 60.

2. The method of claim 1, wherein the first preset value is 60, and the second preset value is 14.

3. A method for accessing a memory of a de-interleaving unit to read a sequence of de-interleaved frames of data stored in the memory of the de-interleaving unit at address specified by a Read Memory Address RMA based on a Read Frame Index RFIDX and a Code Word Count CWCNT;

the method comprises the steps of:

setting the RFIDX, RMA, and CWCNT; checking whether RFIDX is less than 4;

in the case of WFIDX being less than 4, checking whether CWCNT is less than a first preset value;

in the case of CWCNT being less than the first preset value, adding 120 to RMA;

in the case of CWCNT being equal to the first preset value, adding 60 to RMA;

in the case of CWCNT being greater than the first preset value, subtracting 116 from RMA;

in the case of RFIDX being equal to or greater than 4, checking whether RFIDX is less than a second preset value;

in the case of RFIDX being less than the second preset value, checking whether CWCNT is less than the first preset value;

in the case of CWCNT being less than the first preset value, adding 120 to RMA;

in the case of CWCNT being equal to the first preset value, subtracting 56 from RMA;

in the case of CWCNT being greater than the first preset value, subtracting 116 from RMA;

in the case of RFIDX being equal to or greater than the second preset value, checking whether CWCNT is less than the first preset value;

in the case of CWCNT being less than the first preset value, checking whether the result of dividing RFIDX by 4 is equal to the result of 29 minus CWCNT;

in the case of the result of dividing RFIDX by 4 being equal to the result of 29 minus CWCNT, adding 4 to RMA;

in the case of the result of dividing RFIDX by 4 being unequal to the result of 29 minus CWCNT, adding 120 to RMA;

in the case of CWCNT being equal to the first preset value, adding 60 to RMA;

in the case of CWCNT being greater than the first preset value, subtracting 116 from RMA;

based on the current value of WMA, reading data from the RMA-specified address in the memory of the de-interleaving unit;

increasing CWCNT by one;

checking whether the current CWCNT value is equal to or greater than 28;

in the case of CWCNT being equal to or greater than 28, adding 1 to RFIDX;

checking whether the current RFIDX value is equal to or greater than 116; if YES, ending the procedure; whereas if NO, the procedure returns to the setting step; and in the case of CWCNT being less than 28, returning to the step of checking whether WFIDX is less than 60.

4. The method of claim 3, wherein the first preset value is 14, and the second preset value is 60.

* * * * *